United States Patent
Guillet et al.

(10) Patent No.: US 7,180,177 B2
(45) Date of Patent: Feb. 20, 2007

(54) POWER SUPPLY COMPONENT ASSEMBLY ON A PRINTED CIRCUIT AND METHOD FOR OBTAINING SAME

(75) Inventors: Michel Guillet, Angers (FR); Jean-Claude Guignard, Angers (FR)

(73) Assignee: Universite D'Angers, Angers Cedex (FR)

( * ) Notice: Subject to any disclaimer, the term of this patent is extended or adjusted under 35 U.S.C. 154(b) by 0 days.

(21) Appl. No.: 10/513,627

(22) PCT Filed: May 7, 2003

(86) PCT No.: PCT/FR03/01426

§ 371 (c)(1),
(2), (4) Date: Dec. 13, 2004

(87) PCT Pub. No.: WO03/096414

PCT Pub. Date: Nov. 20, 2003

(65) Prior Publication Data

US 2005/0151245 A1    Jul. 14, 2005

(30) Foreign Application Priority Data

May 7, 2002    (FR) .................................. 02 05777

(51) Int. Cl.
*H01L 23/24*    (2006.01)

(52) U.S. Cl. ...................................... 257/712; 438/123
(58) Field of Classification Search ................ 257/678, 257/712; 438/123, 122
See application file for complete search history.

(56) References Cited

U.S. PATENT DOCUMENTS

| | | | | |
|---|---|---|---|---|
| 5,825,625 | A | * 10/1998 | Esterberg et al. | 361/719 |
| 6,156,980 | A | * 12/2000 | Peugh et al. | 174/252 |
| 6,490,161 | B1 | * 12/2002 | Johnson | 361/704 |
| 6,900,987 | B2 | * 5/2005 | Belady et al. | 361/719 |

* cited by examiner

*Primary Examiner*—Roy Karl Potter
(74) *Attorney, Agent, or Firm*—Briggs and Morgan, P.A.; Gerald E. Helget; Nelson R. Capes

(57) ABSTRACT

The invention concerns an assembly of at least one electrical or electronic power supply component on a printed circuit board (10) characterized in that said or at least one electrical or electronic power supply component (30) is directly mounted in close thermal contact on a thermally conductive conduction board (20) itself mounted in an opening (13) comprised in said printed circuit board (10), the lugs (32) of said or at least one electrical or electronic power supply component (30) being connected directly on the printed circuit (10).

7 Claims, 3 Drawing Sheets

Figure 1:
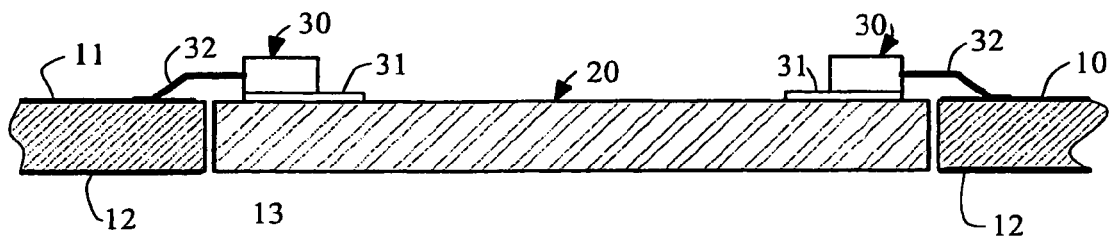

POWER SUPPLY COMPONENT ASSEMBLY ON A PRINTED CIRCUIT AND METHOD FOR OBTAINING SAME

This invention concerns an assembly of electrical or electronic power supply components on a printed circuit and a method for obtaining this type of assembly.

In electronics, it is common to use a printed circuit designed to receive electrical or electronic components that are connected to one another via soldering to connection lines generally made of copper and printed on the printed circuit board. These electrical or electronic components include power supply components that, because they are traversed by relatively high current magnitudes, dissipate heat. We know to use heat sinks, still called radiators, to dissipate this heat so that the temperature of these electrical or electronic power supply components does not get too high and risk damaging them.

Furthermore, in order to better dissipate their heat, these electrical or electronic power supply components are mounted on a metal sole plate which, for construction reasons, is electrically connected to the potential of one of the pins.

Mounting these components on a printed circuit therefore presents a problem for the dissipation of the heat they emit. We are familiar, particularly through patent WO-A-96 13966, with a component assembly in which the components are mounted on a ceramic plate, which is placed in an opening provided in a main printed circuit. Pins ensure both the connection of the ceramic plate and the electrical connection of the components to the printed circuit.

This type of assembly is not optimal from the standpoint of heat dissipation, since there is an electrically insulating layer, but also, as a consequence, a thermally insulating layer between the component and the heat sink.

The goal of this invention is to propose an assembly of power supply components on a printed circuit whose heat dissipation is optimized.

To achieve this goal, an assembly according to this invention is characterized in that the or at least one electrical or electronic power supply component is mounted directly in close thermal contact on a heat conductive conduction plate that is itself mounted in an opening contained in the printed circuit board and in that the pins of the or at least of one electrical or electronic component are connected directly to the printed circuit.

Advantageously, said conduction plate is made of a metal such as copper, brass or any other weldable metal.

According to another feature of the invention, it comprises at least one dissipation device in close thermal contact with said conduction plate. Advantageously, the or each dissipation device is attached to the printed circuit board.

Still advantageously, the surface of the base of said dissipation device is larger than the surface of the opening in which the conduction plate is mounted so that it can cover said conduction plate and rest on the printed circuit board.

According to advantageous modes of embodiment, the conduction plate comprises a zone that partially or completely covers its surface and that consists of an insulating layer and a conductive layer, said zone being able to accommodate surface components and said conductive layer being engraved so as to ensure different electrical connections between components, connections that are electrically insulated from the conduction plate.

This invention also concerns a bearing and connection component for electrical or electronic power supply components intended to constitute a conduction plate for an assembly like the one just described. This component is characterized in that it consists of a heat conductive conduction base comprising a zone that partially covers its surface and that consists of an insulating layer and of a conductive layer. Advantageously, said conductive layer is made of an electrically conductive material that can be engraved in order to be able to ensure different electrical connections between components.

This invention further concerns a method for assembling at least one electrical or electronic power supply component on a printed circuit board characterized in that it comprises the following steps:

a) positioning of the electrical or electronic component(s) on a heat conductive conduction plate, b) positioning of the unit thus formed on said printed circuit board, c) soldering of the pins of the electrical or electronic component(s) onto the printed circuit of said printed circuit board.

Between step a) and step b), said component(s) are advantageously attached using soldering flux, and after step b), the unit is placed in the oven so that as the soldering flux heats up, it definitively solders the component(s) to the conduction plate.

According to another feature of the invention, this assembly process also includes a step during which a dissipation device is attached in close contact with the conduction plate. It also includes a step for attaching the dissipation device to the printed circuit board.

Figure 3:
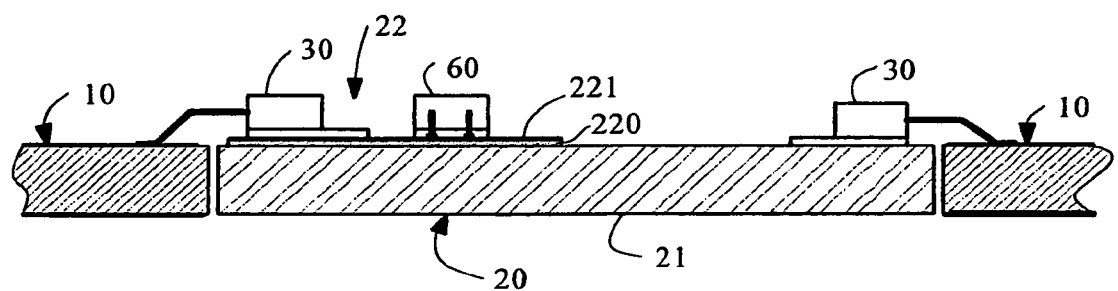
Figure 4:
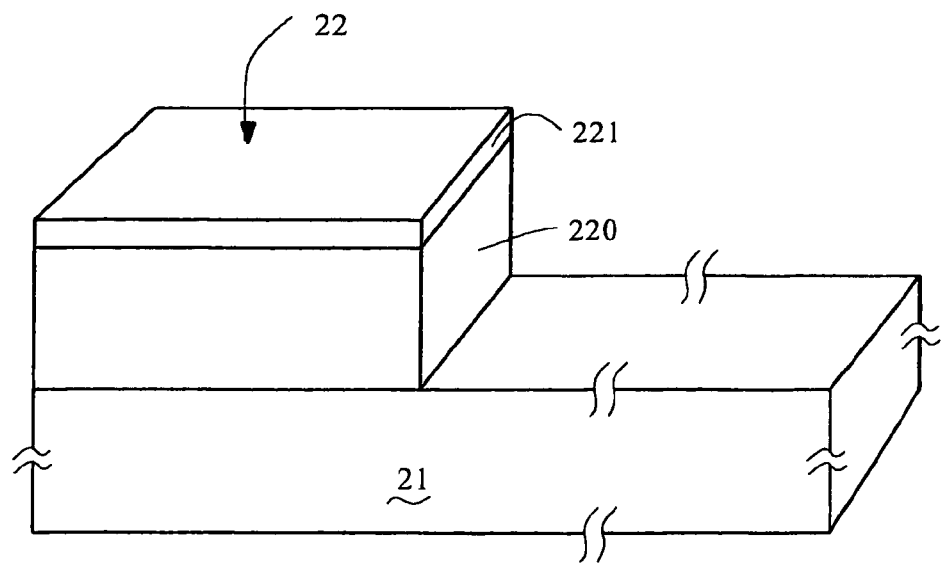
Figure 2A:
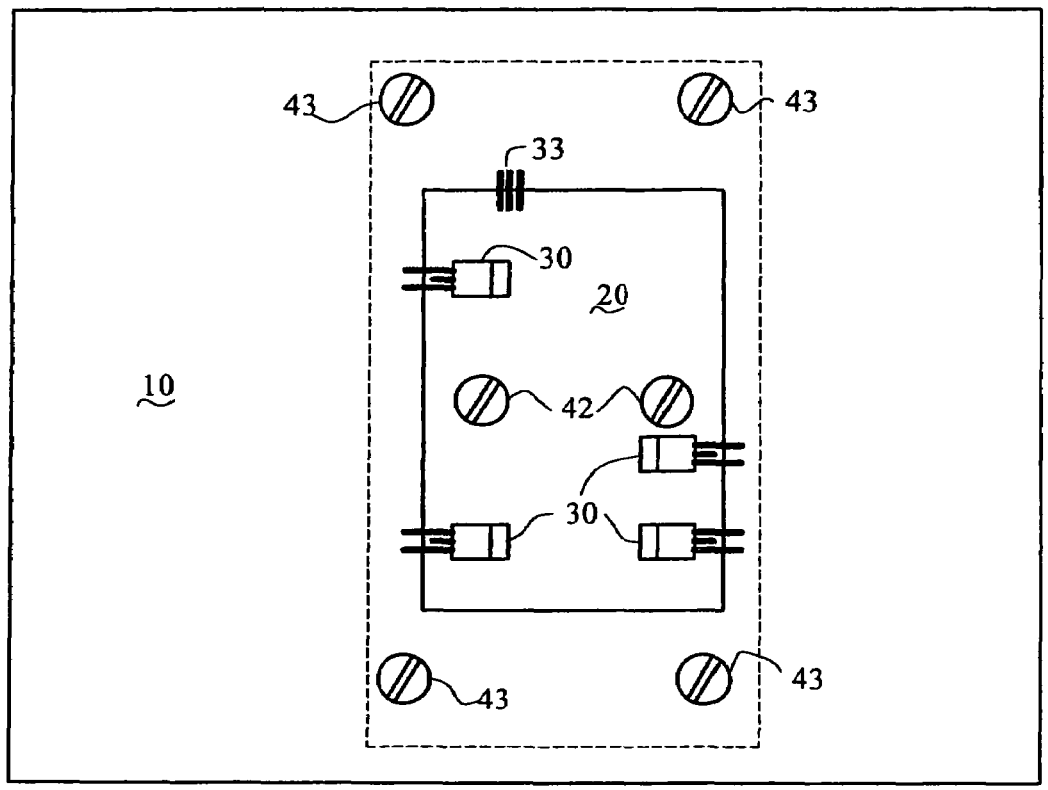
Figure 2B:
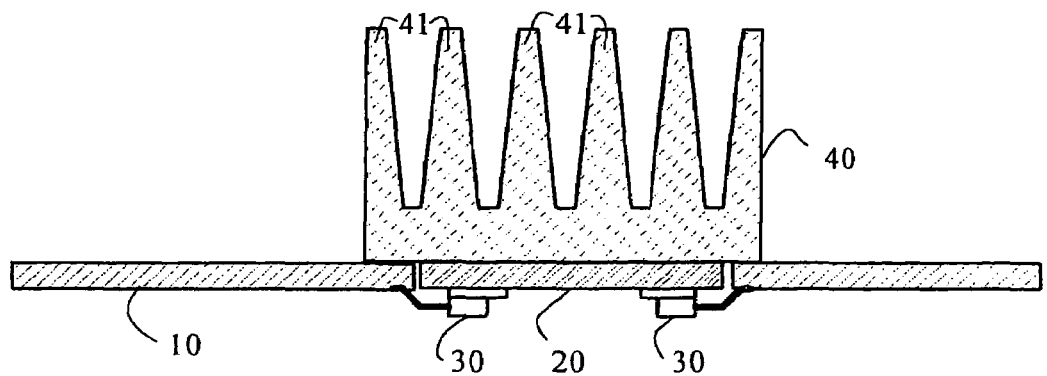
Figure 5A:
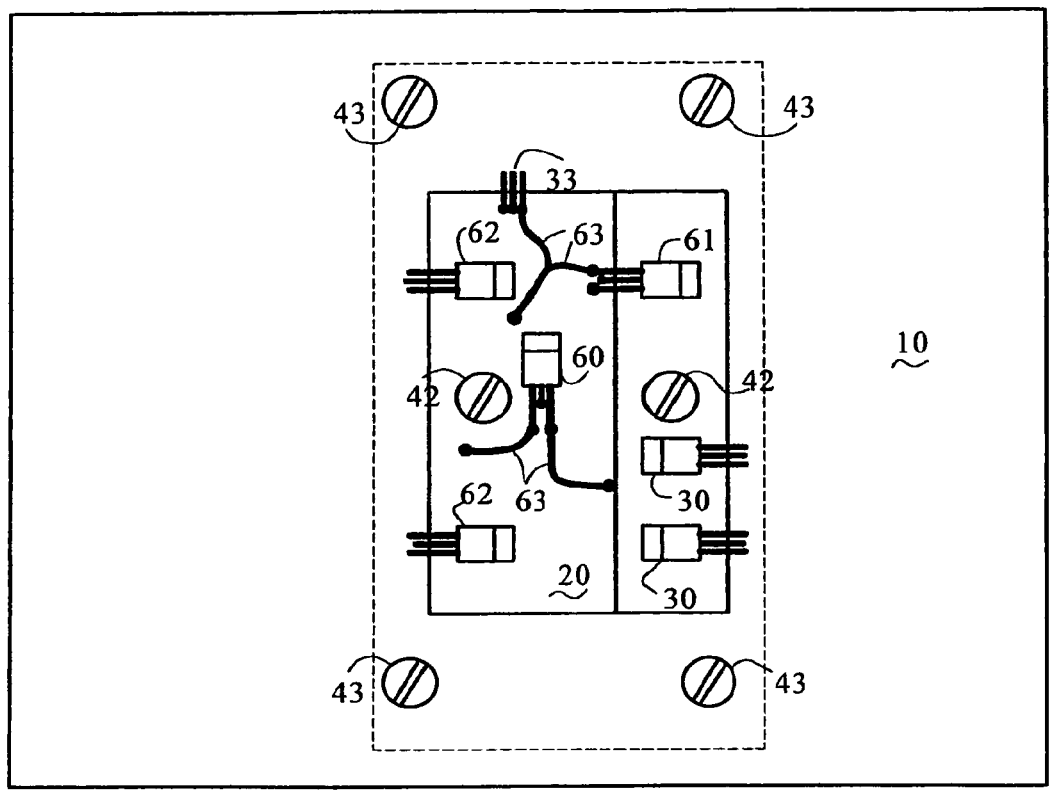
Figure 5B:
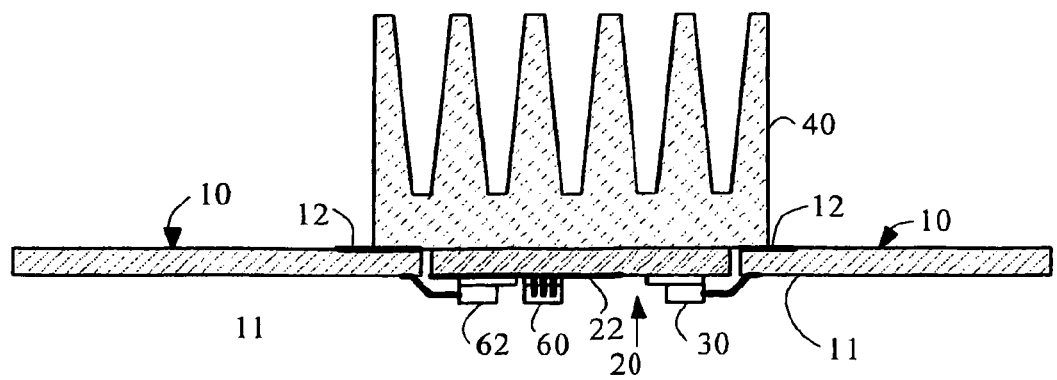

The features of the invention mentioned above along with others will become clearer upon reading the description of examples of modes of embodiment of the invention, a description given in relation to the attached Figures, which include:

FIG. 1 is a cross-section of an assembly produced according to a first mode of embodiment of the invention, FIGS. 2a and 2b are respectively plan and sectional views of an assembly according to the same first mode of embodiment of the invention but with an added cooling element, FIG. 3 is a sectional view of an assembly produced according to a second mode of embodiment of the invention, and FIG. 4 is a 3-dimensional view of a bearing and connection component for electronic power supply components used in assemblies according to the invention, FIGS. 5a and 5b are respectively plan and sectional views of an assembly according to the same second mode of embodiment of the invention, but with an added cooling element.

In FIG. 1 we can see a printed circuit board (10) comprising at least one face 11, 12 on which is printed an electric circuit consisting of electrical connection lines for electrical or electronic components (not shown). For example, these components may be electrical or electronic surface components, still called SMC (Surface Mounted Components), that are thus soldered onto the same face 11, 12 as the lines ensuring their connection.

The board 10 has an opening 13 in which is mounted a heat conductive conduction plate 20, for example made of a metal such as copper, brass or any other weldable metal. In the embodiment example represented, the conduction plate (20) shown is as thick as the printed circuit board 10. Thus, the faces of the conduction plate 20 can be located in the same planes as the faces of the printed circuit board 10.

The conduction plate 20 bears electrical or electronic power supply components 30 whose sole plates 31 are directly in close thermal contact with the conduction plate

(20) and whose pins 32 are soldered, for their electrical connection, to a printed face 11 of the printed circuit board 10. It will be understood that in this mode of embodiment, the pins 32 also make it possible to keep the unit consisting of the conduction plate 20 and the power supply components 30 in place on the printed circuit board (10).

We will note that for this mounting, the sole plate 31 of a component 30 is insulated from its connection pins 32 and from the connection pins of the other components, as well as from the conducting lines present on the faces 11 and 12 of the printed circuit board 10.

The mode of embodiment represented in FIGS. 2a and 2b is roughly identical to the one represented in FIG. 1 (identical reference numbers identify identical elements), but it also comprises a heat dissipation device 40 mounted in close contact with the conduction plate 20 on the opposite face of this conduction plate to the one that bears the power supply components 30. Mounting screws 42 anchor the device 40 to the conduction plate 20. Furthermore, the device 40, whose base surface is larger than the surface of the opening 12 in order to be able to cover the conduction plate 20 while resting on the printed circuit board 10, is fixed to the printed circuit board 10 using mounting screws 43, for example.

In the mode of embodiment shown, the dissipation device 40 is a heat sink that is equipped with cooling fins 41. Nevertheless, it will be understood that this could be a relatively thick plate so as to be able to absorb power spikes. This could also be an absorbent plate at the end of a heat pipe whose other end is equipped with a heat sink.

We will note that the means of attachment using mounting screws 42 and 43 may be replaced by adhesives, spring clamps or any other equivalent means with potential lubrication of the heat seals.

The unit made up of the conduction plate 20 bearing the power supply components 30 and the heat sink 40 is thus firmly mounted on the printed circuit board 10.

We will note in FIG. 2a the use of SMC connectors 33 as electrical components 30.

FIG. 3 shows another mode of embodiment that differs from the mode of embodiment represented in FIG. 1 essentially in that the conduction plate 20 consists of a conduction base 21 of which a zone 22 that covers only part of the surface of the base consists of an insulating layer 220 receiving a conductive layer 221 on its other face. The insulating layer 220 is, for example, a thin layer of epoxy or ceramic, etc., while the conductive layer 221 is advantageously a layer of copper.

The conductive layer 221 may, for example, be engraved (using known techniques) to allow the routing of components, generally of the SMC type, such as component 60. It will be understood that an entire part of an electronic circuit with its own components such as resistors, condensers, integrated circuits, power supply components, etc., may be present in the zone 22.

As for the conduction base 21, it is made of a material with good heat conduction such as copper, brass or any other weldable material.

It will be noted that the conduction base 21 together with its zone 22 can form a single component that will then be used to bear electronic components and to allow some, and even all of them, their electrical connections, just like a printed circuit board. This type of bearing and connection component for electrical or electronic power supply components is represented in FIG. 4 where we can see the conduction base 21 equipped with its zone 22 consisting of the insulating layer 220 and the conductive layer 221. This type of component may be manufactured in long lengths and cut on demand depending on the use envisioned.

This component will be used so that, by means of standard treatments known to the person skilled in the art, the conductive layer 221 can be engraved and printed to allow the routings required by the use considered.

The mode of embodiment represented in FIGS. 5a and 5b is roughly identical to the one represented in FIG. 3, but like the mode of embodiment represented in FIG. 2, it comprises a heat dissipation device 40 mounted in close contact with the conduction plate 20 on the opposite face of this conduction plate to the one that comprises the zone 22 and the one that bears the power supply components 30 and 60. Mounting screws 42 are also used to attach the device 40 to the conduction plate 20, and screws 43 are used to attach it to the printed circuit board 10.

The dissipation device 40 can be a sink equipped with cooling fins 41, a relatively thick plate, an absorbent plate at the end of a heat pipe whose other end is equipped with a sink, etc.

It will be noted that in FIG. 5a, the conductive layer 221 shown has been engraved, since certain conduction lines 63 can be seen.

We will note in this FIG. 5a component 60, which is mounted directly onto the zone 22 and whose pins are also soldered in this zone 22, component 61, which rests on the conduction plate 20, but whose pins are soldered in zone 22, components 62, which are attached to the zone 22 and whose pins are soldered onto the printed circuit board 10 and components 30, which rest on the conduction plate 20, but whose pins are on the printed circuit board 10.

In the mode of embodiment represented in FIG. 5b, the dissipation device 40 is in electrical contact with the printed circuit of face 12 of the printed circuit board 10. This ensures the electrical continuity between the electrical circuit of the board 10 and the conduction plate 20. We will note that screws 43 can also play this role between the face 11 of the board 10 and the conduction plate 20.

In all of the modes of embodiment described above, to implement the assembly, we can proceed as follows: The components 30 (potentially 60, 61 and 62) are positioned on the conduction plate 20, on the conduction base 21 or, depending on the case, in the zone 22. The components 30 (and 62) have their connection pins 32 that overhang the sides of the plate 20. These components 30 (potentially 60, 61, 62) are, for example, attached to the conduction plate 20 by means of soldering flux. The unit is then positioned on the printed circuit board 10 so that the connection pins 32 rest on the printed circuit lines provided for their connections.

The components intended to be on the printed circuit board 10 or some of them are also positioned as previously.

This unit assembled in this manner is placed in the oven so that when the soldering flux heats up, it definitively attaches the power supply components 30 (60, 61, 62) to the conduction plate 20 (or the conduction base 21 or its zone 22) by soldering them.

The other components that have not yet been positioned are then mounted onto the printed circuit board 10. These other components as well as the plate 20 components 30 (60, 61, 62) unit are then soldered onto the board 10, for example using a remelting process rather than a wave soldering process, which is difficult to use because of the metal plate.

Mounting may stop here if a dissipation device such as the device 40 is not planned. Otherwise, after the operations mentioned above (sic), the heat sink 40 is screwed to the conduction plate 20 using screws 42, and to the printed circuit board 10 using screws 43.

The advantages of this invention reside in the excellent thermal contact between the sole plates 31 of the components 30 and the conduction plate 20, as well as the heat sink 40, if used, reducing their heat resistance. As a result, it is possible to reduce the volume, the weight and, as a consequence, the cost of the heat sink 40 and even to eliminate it entirely.

Large currents can be routed toward the power supply components 30, 61 via the conduction base 21 or the heat sink 40, if used, which are good conductors of electricity.

In state of the art assemblies, several components mounted electrically are generally needed in order to reduce the energy dissipated by each of them and, as a consequence, their heat dissipation. Because the thermal resistance of the assembly of this invention is reduced, it is possible to reduce the number of power supply components for a same consumed electrical power compared to the state of the art.

Another advantage of this invention resides in the enhanced transmission of power transients tolerated by the components due to a lower time constant for the heat dissipation performed by the assembly according to the invention.

Another advantage of this invention stems from the improved coupling between the sole plates of the power supply components, which makes it possible to reduce the dispersion of the electrical parameters dependant on temperature.

The assembly according to this invention makes it possible to simplify the routing of the pins of the components because all the conductive faces of the printed circuit can be used, contrary to what happens in the state of the art.

It will be noted that it would be possible to provide two sinks 40, one for each face of the conduction plate 20.

The invention claimed is:

1. An assembly of at least one electrical or electronic power supply component having pins, comprising:
    an electrical or electronic power supply component mounted directly in close thermal contact on a heat conductive conduction plate (20), that is itself mounted in an opening (13) contained in a printed circuit board (10), the pins (32) of the or of at least one electrical or electronic power supply component (30) being connected directly to the printed circuit (10) and said assembly comprising at least one dissipation device (40) larger than the surface of the opening (13) in which said conduction plate (20) is mounted, said dissipation device (40) being in close thermal contact with said conduction plate (20), characterized in that the or each dissipation device (40) is rested and is attached to the printed circuit board (10).

2. The assembly as claimed in claim 1, wherein the conduction plate (20) is made of a metal such as copper or brass or any other weldable material.

3. The assembly as claimed in claim 1 wherein the conduction plate (20) comprises a zone (22) that partially or completely cover its surface and that consists of an insulating layer (220) and a conductive layer (221), said zone (22) being capable of accommodating surface components (60, 62) and said conductive layer (221) being engraved in order to ensure different electrical connections between components, connections that are electrically insulated from the conduction plate (20).

4. Bearing and connection component for electrical or electronic power supply components of the type made up of a conduction plate (20) to be mounted in an opening (13) contained in a printed circuit board (10) and bearing at least one electrical or electronic power supply component (30) mounted directly in close thermal contact onto the conduction plate (20), wherein the conduction plate (20) is made up of a heat conductive conduction base (21) comprising a zone (22) that partially covers its surface and that is made up of an insulating layer (220) and a conductive layer (221), said zone (22) being able to accommodate surface components (60, 62) and said conductive layer (221) being made of an electrically conductive material that can be engraved in order to ensure different electrical connections between components, connections that are electrically insulated from the conduction plate (20).

5. A method for assembling at least one electrical or electronic power supply component on a printed circuit board (10), characterized in that it comprises the following steps:
    a. positioning of the electrical or electronic component(s) (30, 60, 61, 62) directly and in close contact on a heat conductive conduction plate (20),
    b. positioning of the unit thus assembled in the opening (13) contained in said printed circuit board (10),
    c. soldering of the pins of the electrical or electronic component(s) (30, 60, 61, 62) onto the printed circuit of the printed circuit board (10), and
    d. attaching a dissipation device (40) to said printed circuit board (10) in close contact with the conduction plate (20).

6. The assembly method as claimed in claim 5, wherein between step a) and step b), the electrical or electronic component(s) (30, 60, 61, 62) are attached by means of soldering flux and wherein after step b), the unit is placed in the oven so that when the soldering flux heats up, it definitely solders the electrical or electronic component(s) onto the conduction plate (20).

7. The assembly as claimed in claim 2 wherein the conduction plate (20) comprises a zone (22) that partially or completely covers its surface and that consists of an insulating layer (220) and a conductive layer (221), said zone (22) being capable of accommodating surface components (60, 62) and said conductive layer (221) being engraved in order to ensure different electrical connections between components, connections that are electrically insulated from the conduction plate (20).

* * * * *